US007239005B2

(12) United States Patent
Sekimoto

(10) Patent No.: US 7,239,005 B2
(45) Date of Patent: Jul. 3, 2007

(54) SEMICONDUCTOR DEVICE WITH BYPASS CAPACITOR

(75) Inventor: Yasuhiko Sekimoto, Hamakita (JP)

(73) Assignee: Yamaha Corporation (JP)

( * ) Notice: Subject to any disclaimer, the term of this patent is extended or adjusted under 35 U.S.C. 154(b) by 369 days.

(21) Appl. No.: 10/893,357

(22) Filed: Jul. 19, 2004

(65) Prior Publication Data

US 2005/0012159 A1 Jan. 20, 2005

(30) Foreign Application Priority Data

Jul. 18, 2003 (JP) ............................ 2003-199277

(51) Int. Cl.
*H01L 29/00* (2006.01)

(52) U.S. Cl. ....................... 257/532; 257/306; 257/758

(58) Field of Classification Search ........ 257/296–313, 257/532, 533, 595–602, 923, 924, 758
See application file for complete search history.

(56) References Cited

U.S. PATENT DOCUMENTS 6,054,751 A 4/2000 Ichikawa et al.
6,147,857 A * 11/2000 Worley et al. ........... 361/301.2

FOREIGN PATENT DOCUMENTS

| | | |
|---|---|---|
| JP | 54-069087 | 6/1979 |
| JP | 60-074470 | 4/1985 |
| JP | 60-161655 | 8/1985 |
| JP | 02-202051 | 8/1990 |
| JP | 10-150148 | 6/1998 |
| JP | 10-326868 | 12/1998 |

* cited by examiner

*Primary Examiner*—M. Wilczewski
*Assistant Examiner*—Monica Lewis
(74) *Attorney, Agent, or Firm*—Dickstein, Shapiro, LLP.

(57) ABSTRACT

A semiconductor device comprises a semiconductor substrate having first and second active regions of first conductivity type, first and second insulated electrodes crossing the first and second active regions, respectively, a third insulated electrode formed on the second insulated electrode, source/drain regions formed on both sides of the first electrode, pseudo source/drain regions formed on both sides of the second electrode, first and second power source lines formed above the second active region through an interlevel insulating layer, a first interconnection connecting the third electrode and the pseudo source/drain regions to the first power source line, and a second interconnection connecting the second electrode to the second power source line, wherein the first active region constitutes a MOS transistor and the second active region constitutes a bypass capacitor and induces an inversion layer of the second conductivity type under the second electrode structure when the power source lines are activated.

13 Claims, 7 Drawing Sheets

SEMICONDUCTOR DEVICE WITH BYPASS CAPACITOR

CROSS REFERENCE TO RELATED APPLICATION

This application is based on and claims priority of Japanese Patent Application No. 2003-199277 filed on Jul. 18, 2003, the entire contents of which are incorporated herein by reference.

BACKGROUND OF THE INVENTION

A) Field of the Invention

The present invention relates to a semiconductor integrated circuit (IC) device to be used with a portable equipment and the like, and more particularly to a semiconductor device aiming at suppressing a power source voltage fluctuation and unnecessary radiation.

B) Description of the Related Art

As shown in FIG. 4A, when a semiconductor integrated circuit (IC) package 110 is mounted on a printed circuit board 120 or the like and used with other circuits, a bypass capacitor 103 of about 1 μF is externally connected between a lead 101 for a package power source voltage and a ground plane 102 of the printed circuit board to suppress a fluctuation of the voltage to be supplied to IC. In the IC package 110, a power source voltage pad 107 on a silicon chip 130 is connected by a bonding wire to the package power source voltage lead 101. An internal circuit of IC is connected to the bypass capacitor 103 via the pad 107, bonding wire 105 and lead 101.

The bypass capacitor externally connected to IC and a noise cancelling circuit for signal lines can suppress to some degree a power source voltage fluctuation outside IC and noises on signal lines. However, it is difficult to perfectly prevent a power source voltage fluctuation inside IC and malfunctions and noises of the IC internal circuits by the external electrostatic discharge etc. In the following, a mechanism of a power source voltage fluctuation inside IC will be considered.

As shown in FIG. 4B, when a change ΔI in a current I occurs, a potential (power source voltage) of power source lines $V_{DD}$ and $V_{SS}$ having a wiring resistance R changes by $\Delta V=\Delta I*R$, where the current I flows when a signal rises or falls and a total capacitance C is charged or discharged. The capacitance C includes a wiring capacitance, a transistor gate capacitance and a transistor junction capacitance. This change in the power source potential becomes power source noises and has the influence upon a frequency band several hundred to several thousand times the frequency of a clock signal (internal circuit operation frequency).

As shown in FIG. 4C, the bypass capacitor 103 is connected to IC via the lead 101 and bonding wire 105. The lead 101 and bonding wire 105 have an equivalent inductance component L and reactance component RC. In the high frequency band, the inductance component L is dominant resulting in a high impedance. The bypass capacitor 103 externally connected to IC and the inside of IC are separated by the inductance L in the high frequency band. Power source noises generated by the operation of internal circuits of IC are hard to be sufficiently absorbed by the bypass capacitor. Power source noises generated inside IC leak to the external from signal input/output pads so that IC becomes a high frequency noise source.

Power source noises generated inside IC influence the operation of functional blocks constituting IC and each functional block operates erroneously in some cases. In an IC having both analog and digital circuits among other IC's, power source noises generated by a switching operation of digital circuits influence the operation of analog circuits. This inevitably leads to the deteriorated IC characteristics. It is desired to suppress a fluctuation of a power source voltage inside IC.

Japanese Patent Laid-open Publication No. SHO-60-161655 has proposed that a power source line in IC is used as one electrode and a substrate area along this power source line is used as the other electrode to form a capacitor between the positive and negative power source lines, this capacitor constituting a portion of a bypass capacitor. According to this proposed device, the bypass capacitor can be formed directly between the power source lines inside IC so that a power source voltage fluctuation can be suppressed a little. Capacitance capable of being built in IC by this method has a limit of probably about several hundred pF. Since the total capacitance inside IC (all gate capacitances, all junction capacitances and all wiring capacitances) is several thousand to several ten thousand pF, it is difficult to sufficiently absorb power source noises.

Japanese Patent Laid-open Publication No. HEI-2-202051, Japanese Patent Laid-open Publication No. HEI-10-326868 and Japanese Patent Laid-open Publication No. HEI-10-150148 describe also techniques of forming a capacitance for suppressing a power source fluctuation inside IC. The techniques described in these documents are also hard to form a sufficient capacitance inside IC.

SUMMARY OF THE INVENTION

An object of this invention is to provide a semiconductor device which can form a large capacitance between power source lines inside the semiconductor device so that a power source voltage fluctuations and unnecessary radiation can be suppressed.

According to one aspect of the present invention, there is provided a semiconductor device comprising: a semiconductor substrate having first and second active regions of a first conductivity type; a first insulating layer formed on each of the first and second active regions; first and second electrode structures formed above and crossing across intermediate portions of the first and second active regions, respectively, through the first insulating layer; a second insulating layer formed on the second electrode structure; a third electrode structure formed on the second insulating layer; a pair of first semiconductor regions of a second conductivity type opposite to the first conductivity type, formed in the first active region on both sides of the first electrode structure; a pair of second semiconductor regions of the second conductivity type formed in the second active region on both sides of the second electrode structure; an interlevel insulating layer formed to cover the first, second and third electrode structures; first and second power source lines formed on the interlevel insulating layer above the second active region; a first interconnection structure connecting the third electrode structure and at least one of the second semiconductor regions to the first power source line; and a second interconnection structure connecting the second electrode structure to the second power source line, wherein the first active region constitutes a MOS transistor and the second active region constitutes a bypass capacitor and induces an inversion layer of the second conductivity type under the second electrode structure when the power source lines are activated.

Since a laminated electrode capacitance and a MOS capacitance can be utilized, a large capacitance can be formed between the power source voltage lines inside an IC. A power source voltage fluctuation and unnecessary radiation inside the semiconductor device can be effectively suppressed.

DESCRIPTION OF THE PREFERRED EMBODIMENTS

In the following, description will be made on a semiconductor device having a bypass capacitor according to an embodiment of the invention, with reference to the accompanying drawings. Although a semiconductor device having an n-type active region and a semiconductor device having a p-type active region will be described, these devices may be integrated to form a complementary (C) MOS integrated circuit. In the description, a power source voltage $V_{DD}$ is a positive voltage and $V_{SS}$ is a ground voltage.

Figure 1A:
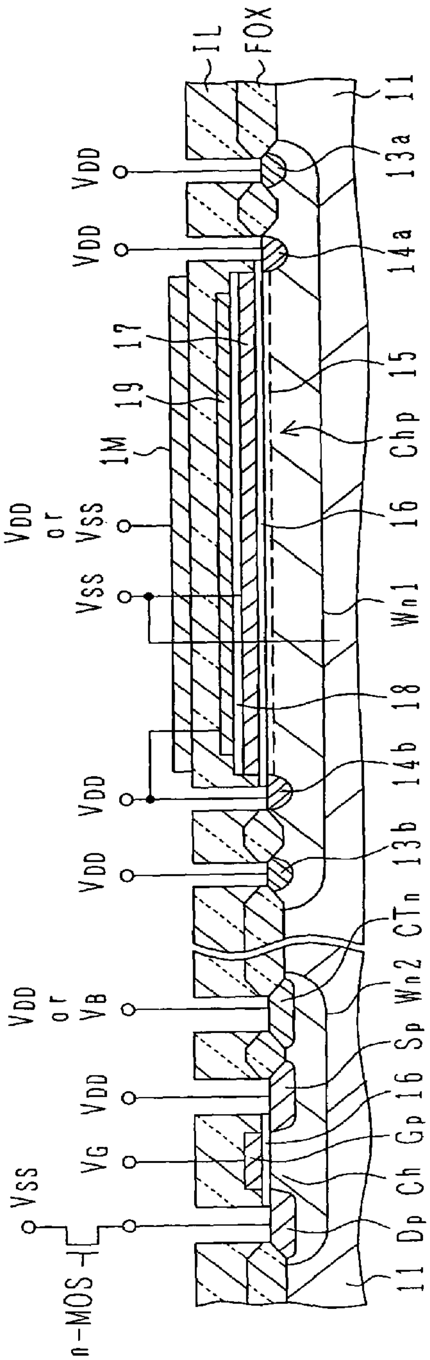
FIG. 1A is a cross sectional diagram of an n-well region of a semiconductor device according to an embodiment.

As shown in FIG. 1A, on the surface of a p-type silicon substrate 11, a field oxide film FOX is formed to define active regions. In FIG. 1A, although the field oxide film is formed by local oxidation of silicon (LOCOS), it may be formed by shallow trench isolation (STI). Impurity ions of an n-type are implanted into active regions to form a first n-type well Wn1 for a bypass capacitor and a second n-type well Wn2 for a p-channel MOS transistor.

The surface of the active regions is thermally oxidized to form a silicon oxide film 16 to be used as a gate insulating film. In the n-type well region Wn1, a first polysilicon layer 17, a silicon oxide layer 18 and a second polysilicon layer 19 are stacked on the silicon oxide film 16, and patterned to form a stacked capacitor structure. In the n-type well region Wn2, a single layer polysilicon film is formed on the gate insulating film 16, and patterned to form a gate electrode Gp. In a manufacture method to be described later, the gate electrode Gp is made of the first polysilicon layer 17. The gate electrode Gp may also be made of the second polysilicon layer 19. In either case, the gate electrode of the p-channel MOS transistor and one of the double polysilicon layers are made of the same layer.

Impurity ions of a p-type are implanted on both sides of the gate electrode Gp and the double polysilicon layers 17 and 19. In a p-channel MOS transistor area, a p-type source region Sp and a p-type drain region Dp are formed. The n-channel well under the gate electrode Gp constitutes a channel Ch. In this manner, a p-channel MOS transistor is formed in the second n-type well Wn2. In a bypass capacitor area, p-type regions 14*a* and 14*b* are formed on both sides of the double polysilicon layers 17 and 19. A structure similar to the p-channel MOS transistor is formed in the first n-type well Wn1, also. The p-type regions 14*a* and 14*b* are called pseudo source/drain regions, the active region therebetween under the first polysilicon layer 17 is called a pseudo channel region Chp and the first polysilicon layer 17 is called a pseudo gate electrode. Well contact n-type regions CTn, 13*a* and 13*b* are formed at other locations in the n-type wells Wn1 and Wn2.

An interlevel insulating layer IL of silicon oxide such as phosphosilicate glass (PSG) is formed covering the gate electrode Gp and double polysilicon layers 17 and 19. Contact holes are formed through the interlevel insulating layer IL to expose predetermined surfaces of the lower layer structure. A first metal layer 1M of aluminum or the like is formed on the interlevel insulating layer IL, and patterned to form power source wiring lines, lead lines and the like. The first metal layer may be formed after conductive plugs of Si, W or the like are buried in the contact holes.

Figure 1B:
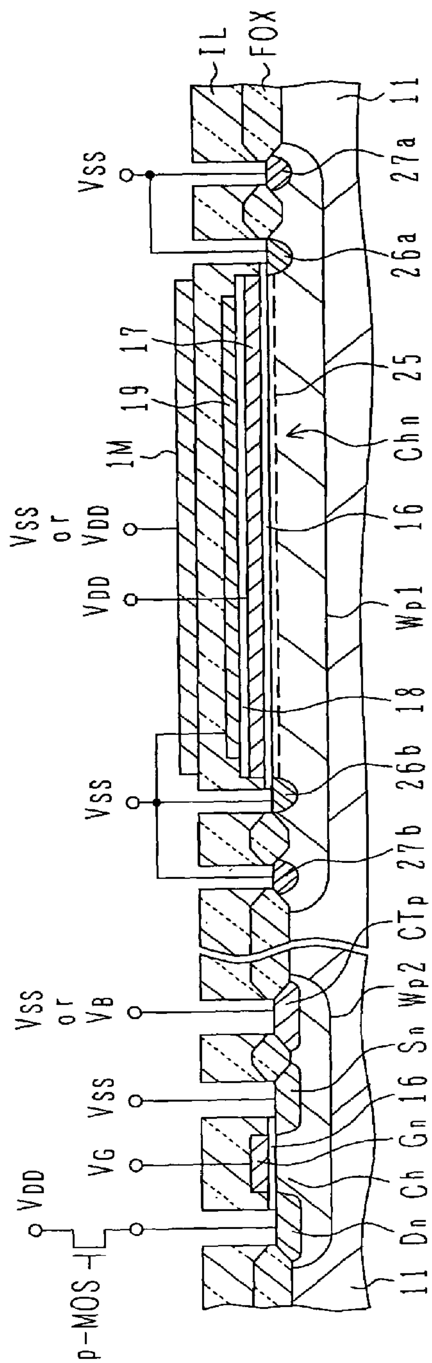
FIG. 1B is a cross sectional diagram of a p-well region of a semiconductor device according to an embodiment.
Figure 1C:
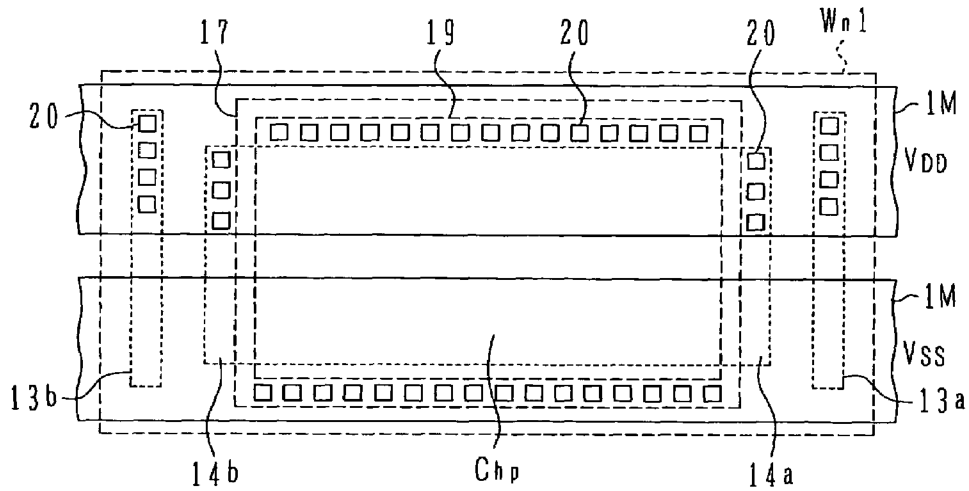
FIG. 1C is a plan view of a capacitor region of the semiconductor device shown in FIG. 1A.

FIG. 1C is a schematic plan view of a bypass capacitor area. The n-type well Wn1 indicated by a broken line is formed in the substrate, and the p-type regions 14*a* and 14*b* and the pseudo channel region Chp therebetween are formed in the active region in the n-type well Wn1 surrounded by the field oxide film. The first polysilicon layer 17 and second polysilicon layer 19 indicated by broken lines are laminated above the substrate. Power source wiring lines $V_{DD}$ and $V_{SS}$ made of the first metal layer 1M are juxtaposed on the interlevel insulating layer covering the second polysilicon layer 19, above the n-type well Wn1. Contacts 20 connect the power source voltage wiring lines $V_{DD}$ and $V_{SS}$ of the first metal layer 1M to lower layers.

Reverting to FIG. 1A, in the p-channel MOS transistor area, the source region Sp is connected to the power source voltage $V_{DD}$ and the drain region Dp is connected to the drain of an n-channel MOS transistor n-MOS the source of which is connected to a ground voltage $V_{SS}$. The gate electrode Gp is connected to a gate voltage $V_G$. The well contact regions are connected to the power source voltage $V_{DD}$ or a back bias voltage $V_B$.

In the bypass capacitor area, at least one of the p-type pseudo source/drain regions 14*a* and 14*b* and the second polysilicon layer 19 are connected to the power source voltage $V_{DD}$, and the pseudo gate electrode (first polysilicon layer) 17 is connected to the ground voltage $V_{SS}$. The p-type silicon substrate 11 is also connected to the ground voltage $V_{SS}$. The n-type well contact regions 13*a* and 13*b* are connected to the power source voltage $V_{DD}$. The power source wiring lines on the interlevel insulating film IL include the wiring line $V_{DD}$ and wiring line $V_{SS}$.

As $V_{DD}$ is applied to the n-type well Wn1 and the ground voltage $V_{SS}$ is applied to the pseudo gate electrode 17, a p-type inversion layer 15 is induced in the surface layer of the pseudo channel region Chp under the pseudo gate electrode 17. Since the p-type pseudo source/drain regions are connected by the p-type inversion layer 15, a lead electrode for one of them is not necessary. A MOS capacitor is formed between the p-type inversion layer 15 and pseudo gate electrode (first polysilicon layer) 17. The first and second polysilicon layers constitute a stacked capacitor. A stacked capacitor is also formed between the second polysilicon layer 19 and power source line $V_{SS}$. A junction capacitance is formed between the n-type well Wn1 and p-type substrate 11.

Figure 1D:
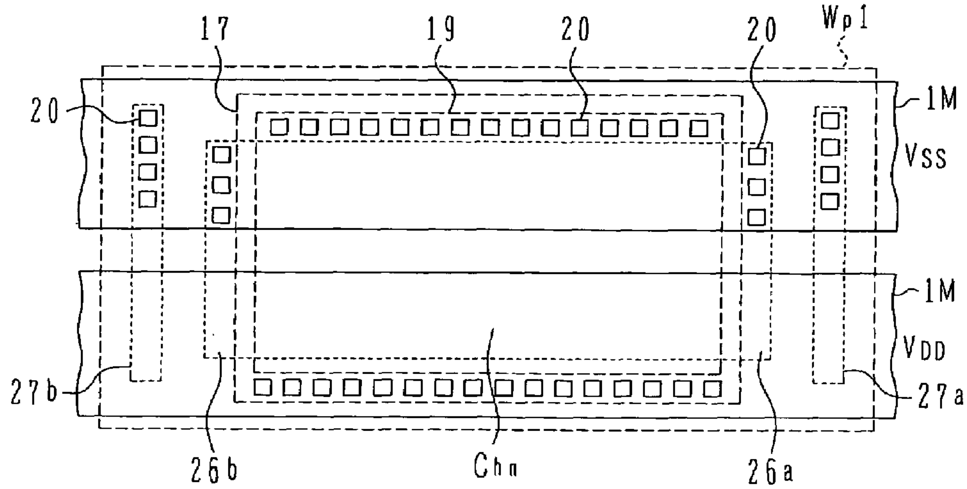
FIG. 1D is a plan view of a capacitor region of the semiconductor device shown in FIG. 1B.
Figure 1E:
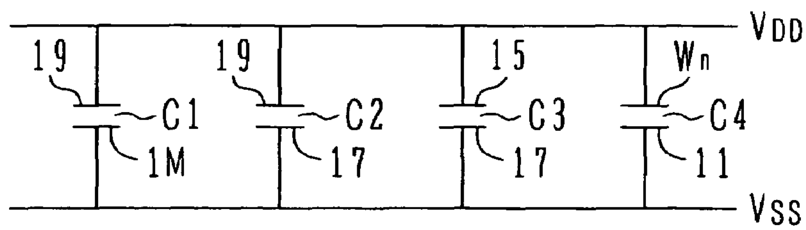
FIG. 1E is an equivalent circuit diagram of the capacitor shown in FIGS. 1A and 1C.

FIG. 1E is an equivalent circuit of these capacitors. For example, a MOS capacitor C3 and a stacked capacitor C2 between the double polysilicon layers have a capacitance of several fF/μm$^2$, a capacitor C1 between the second polysilicon layer 19 and first metal wiring layer 1M with the interlevel insulating film IL interposed therebetween has a capacitance of several $10^{-1}$ fF/μm$^2$, one digit smaller than C3 and C2, and a capacitor C4 between the n-type well Wn1 and substrate 11 has a further smaller capacitance as about several $10^{-2}$ fF/μm$^2$. The capacitors C1, C2, C3 and C4 are connected in parallel, and form a large capacitance.

The description has been made for forming a p-channel MOS transistor and a bypass capacitor analogous to the p-channel MOS transistor in the n-type region. A similar structure can be formed in a p-type region.

FIG. 1B shows a structure of an n-channel MOS transistor and a bypass transistor formed in the p-wells of a p-type silicon substrate. These may also be formed directly in the p-type substrate without forming the p-type wells.

As shown in FIG. 1B, similar to FIG. 1A, on the surface of a p-type silicon substrate 11, a field oxide film FOX is formed to define active regions. Impurity ions of a p-type are implanted into the active regions to form a first p-type well Wp1 for a bypass capacitor and a second p-type well Wp2 for an n-channel MOS transistor.

Similar to FIG. 1A, the surface of the active regions is thermally oxidized to form a silicon oxide film 16 to be used as a gate insulating film. In the first p-type well Wp1 region, a first polysilicon layer 17, a silicon oxide layer 18 and a second polysilicon layer 19 are stacked on the silicon oxide layer 16, and patterned to form a stacked capacitor structure. In the second p-type well Wp2 region, a single layer polysilicon film is formed on the gate insulating film 16, and patterned to form a gate electrode Gn.

Impurity ions of an n-type are implanted on both sides of the gate electrode Gn and the double polysilicon layers 17 and 19. In an n-channel MOS transistor area, an n-type source region Sn and an n-type drain region Dn are formed. The p-channel well under the gate electrode Gn constitutes a channel Ch. In this manner, an n-channel MOS transistor is formed in the second p-type well Wp2. In a bypass capacitor area, n-type regions 26*a* and 26*b* are formed on both sides of the double polysilicon layers 17 and 19. Also in the first p-type well Wp1, the structure similar to the n-channel MOS transistor is formed. The n-type regions 26*a* and 26*b* are called pseudo source/drain regions, the active region therebetween under the first polysilicon layer is called a pseudo channel region Chn and the first polysilicon layer 17 is called a pseudo gate electrode. Well contact p-type regions CTp, 27*a* and 27*b* are formed at other locations in the p-type wells Wp2 and Wp1.

An interlevel insulating layer IL of silicon oxide such as phosphosilicate glass (PSG) is formed covering the gate electrode Gn and double polysilicon layers 17 and 19. Contact holes are formed through the interlevel insulating layer IL to expose predetermined surfaces of the lower layer structure. A first metal layer 1M of aluminum or the like is formed on the interlevel insulating layer IL, and patterned to form power source wiring lines, lead lines and the like. FIG. 1D is a schematic plan view of a bypass capacitor area. The p-type well Wp1 indicated by a broken line is formed in the substrate, and the n-type regions 26*a* and 26*b* and the pseudo channel region Chn therebetween are formed in the active region in the p-type well Wp1 surrounded by the field oxide film. The first polysilicon layer 17 and second polysilicon layer 19 indicated by broken lines are stacked above the substrate. Power source wiring lines $V_{DD}$ and $V_{SS}$ made of the first metal layer 1M are juxtaposed on the interlevel insulating layer covering the second polysilicon layer 19, above the p-type well Wp1. Contacts 20 connect the power source voltage wiring lines $V_{DD}$ and $V_{SS}$ of the first metal layer 1M to lower layers.

Reverting to FIG. 1B, in the n-channel MOS transistor area, the source region Sn is connected to the ground voltage $V_{SS}$ and the drain region Dn is connected to the drain of a p-channel MOS transistor p-MOS, the source of which is connected to the power source voltage $V_{DD}$. The gate electrode Gn is connected to a gate voltage $V_G$. The well contact regions are connected to the ground voltage $V_{SS}$ or a back bias voltage $V_B$.

In the bypass capacitor area, at least one of the n-type pseudo source/drain regions 26*a* and 26*b* and the second polysilicon layer 19 are connected to the ground voltage $V_{SS}$, and the pseudo gate electrode (first polysilicon layer) 17 is connected to the power source voltage $V_{DD}$. The p-type silicon substrate 11 and p-type well contact regions 27*a* and 27*b* are connected to the ground voltage $V_{SS}$. The power source wiring lines on the interlevel insulating film IL include the wiring line $V_{DD}$ and wiring line $V_{SS}$.

As the ground voltage $V_{SS}$ is applied to the p-type well Wp1 and the power source voltage $V_{DD}$ is applied to the pseudo gate electrode 17, an n-type inversion layer 25 is induced in the surface layer of the pseudo channel region Chn under the pseudo gate electrode 17. A MOS capacitor is formed between the n-type inversion layer 25 and pseudo gate electrode (first polysilicon layer) 17. The first and second polysilicon layers constitute a stacked capacitor. A stacked capacitor is also formed between the second polysilicon layer 19 and power source line $V_{DD}$. A junction capacitance will not be formed between the p-type well Wp1 and p-type substrate 11.

Figure 1F:
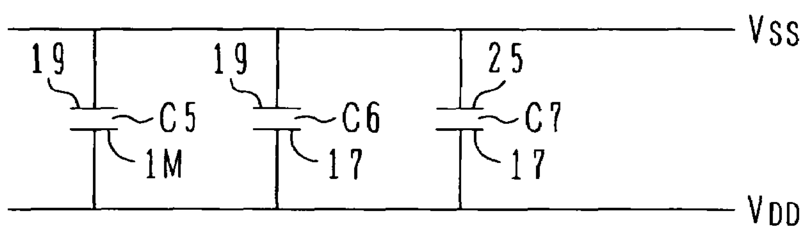
FIG. 1F is an equivalent circuit diagram of the capacitor shown in FIGS. 1B and 1D.

FIG. 1F is an equivalent circuit of these capacitors. For example, a MOS capacitor C7 and a stacked capacitor 62 between the double polysilicon layers have a capacitance of several fF/μm$^2$, a capacitor C5 between the second polysilicon layer 19 and first metal wiring layer 1M with the interlevel insulating film IL interposed therebetween has a capacitance of several $10^{-1}$ fF/μm$^2$, one digit smaller than C7 and C5. The capacitors C5, C6 and C7 are connected in parallel, and form a large capacitance.

Brief description will be made on a method of fabricating the structure shown in FIG. 1A and the structure shown in FIG. 1B on the same semiconductor chip.

Figure 2A:
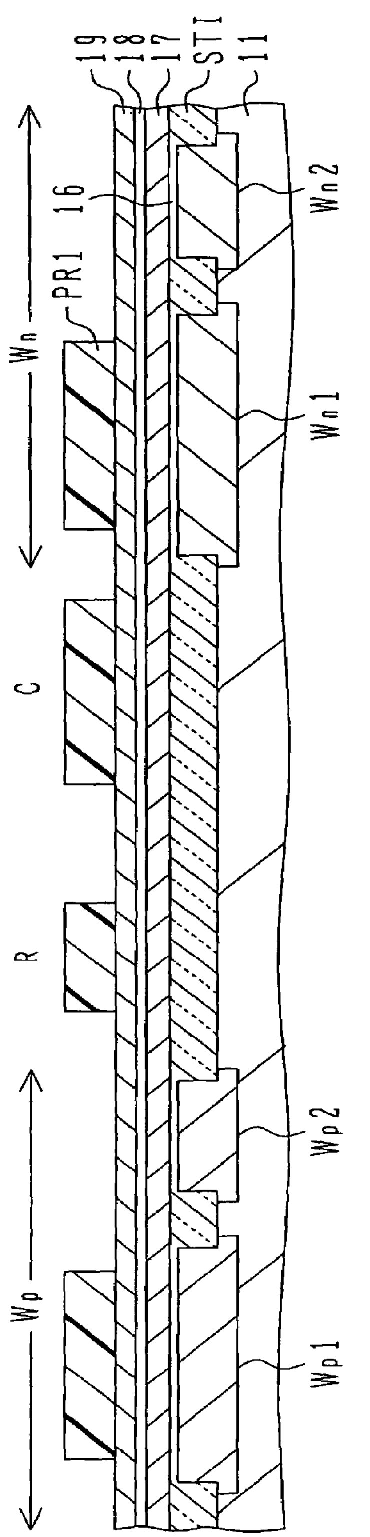
FIGS. 2A–2D are cross sectional views illustrating the main processes of a method of manufacturing a semiconductor device including the structure shown in FIGS. 1A–1D.

As shown in FIG. 2A, on the surface of a p-type silicon substrate 11, an element isolation region STI is formed by shallow trench isolation. Active regions for p-type wells are defined in the left area of FIG. 1A, active regions for n-type wells are defined in the right area, and a region for a resistor R and a capacitor C is reserved on a central isolation region. The p-type well regions and n-type well regions are selectively exposed by resist masks, and p- and n-type impurity ions are implanted to form p-type wells Wp1 and Wp2 and n-type wells Wn1 and Wn2. The surfaces of the active regions are thermally oxidized to form a gate insulating film 16.

On the gate insulating film 16, a first polysilicon layer 17, a silicon oxide layer 18 and a second polysilicon layer 19 are laminated. For example, the polysilicon layers are formed by thermal CVD and the silicon oxide layer 18 is formed by oxidizing the surface of the first polysilicon layer 17. On the second polysilicon layer 19, a resist pattern PR1 is formed covering the regions where bypass capacitors, a resistor and a capacitor are formed. By using the resist pattern PR1 as a mask, the second polysilicon layer 19 and silicon oxide layer 18 are etched.

Figure 2B:
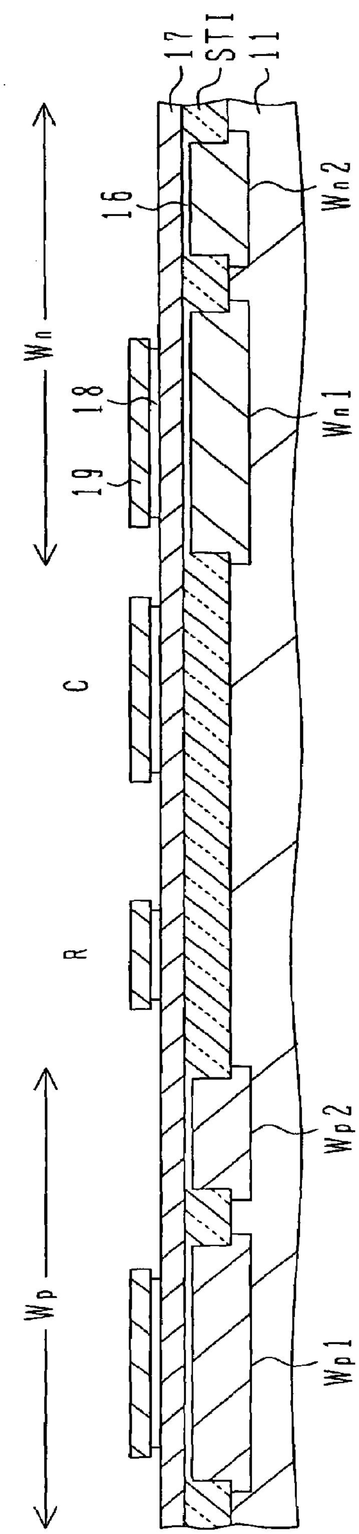

As shown in FIG. 2B, the exposed second polysilicon layer 19 and silicon oxide layer 18 thereunder are therefore removed. Thereafter, the resist pattern is removed. A tungsten silicide layer SL is deposited by sputtering or the like on the substrate surface with the second polysilicon layer 19 and silicon oxide layer 18 selectively removed. A W layer may be deposited and silicified.

Figure 2C:
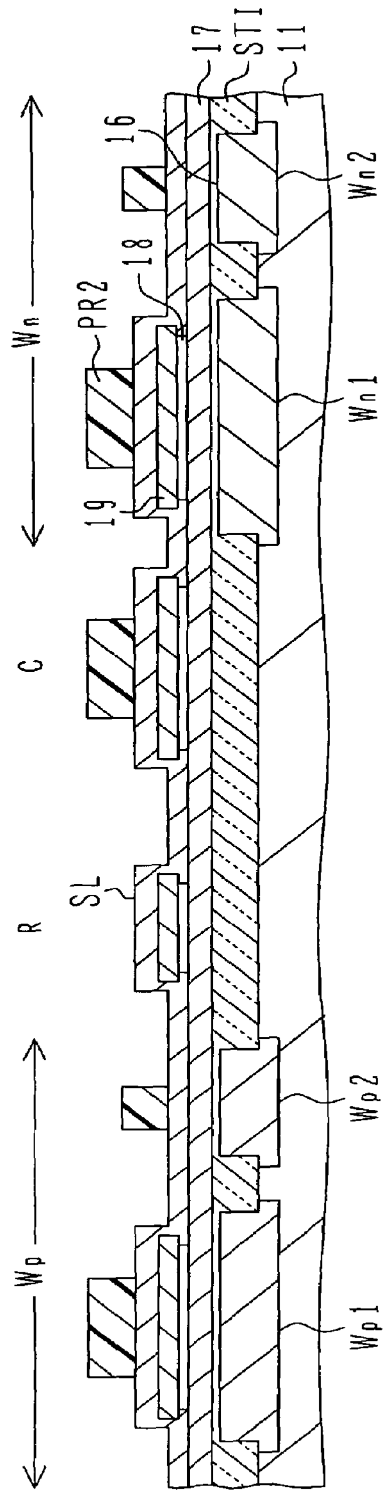

As shown in FIG. 2C, a resist pattern PR2 is formed on the tungsten silicide layer SL, covering the regions where the bypass capacitors, MOS transistors and capacitor are formed. By using the resist pattern PR2 as a mask and the silicon oxide layer as an etching stopper, the tungsten silicide layer SL and polysilicon layers are etched.

Figure 2D:
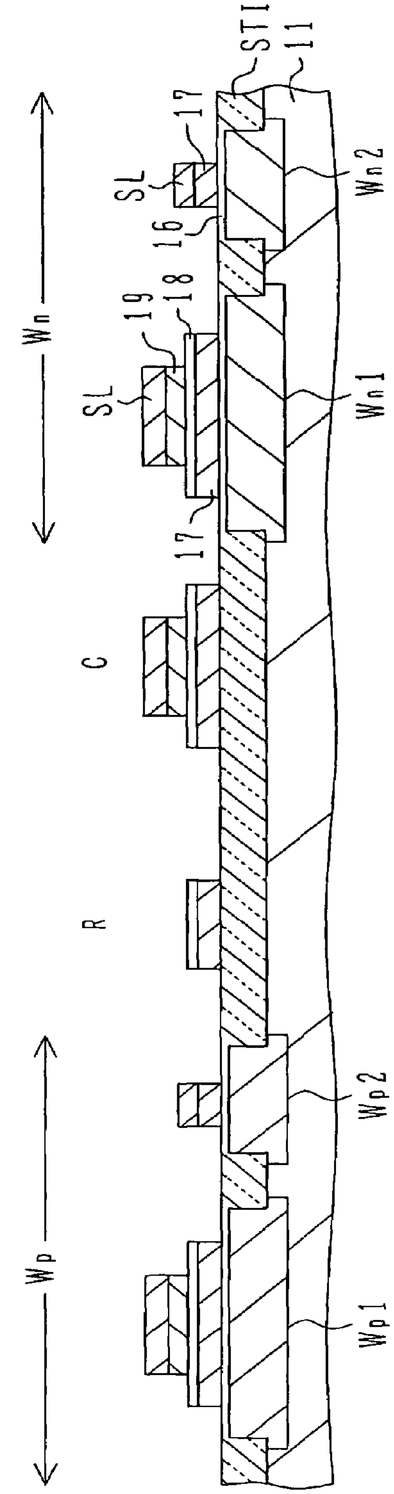

As shown in FIG. 2D, by using the resist pattern PR2 as a mask, the second silicon layer 19 for the bypass capacitors and the silicide layer SL thereon, the first polysilicon layer 17 for the gate electrode of the MOS transistors and the silicide layer SL thereon are patterned. Thereafter, the resist pattern is removed. Then, by using resist patterns for selectively exposing the p-type wells and n-type wells, n- and p-type impurity ions are implanted to form source/drain regions and pseudo source/drain regions. An interlevel insulating film forming process and a wiring forming process are repeated necessary times to complete a semiconductor device.

With the above-described manufacture method, the bypass capacitor can be formed at the same time when the MOS transistor, capacitor and resistor are formed. Since the bypass capacitor can be disposed just under the power source wiring lines, the bypass capacitor can be connected to the power source lines with a small inductance so that it presents excellent high frequency characteristics.

Next, description will be made on an example of a practical application of the invention for further increasing the capacitance of a bypass capacitor by using multi wiring layers disposed on power source lines.

Figure 3A:
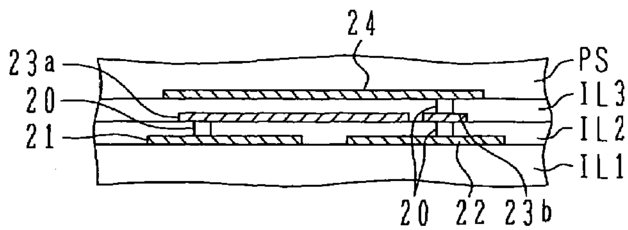
FIGS. 3A and 3B are a cross sectional view and a plan view showing a modification of the capacitor shown in FIGS. 1A–1D.

As shown in FIG. 3A, on a first interlevel insulating film IL1, power source lines 21 and 22 of a first metal layer are formed. A second interlevel insulating film IL2 is formed covering the power source lines 21 and 22. On the second interlevel insulating film IL2, a wiring line 23 (23*a* and 23*b* collectively referred) of a second metal layer is formed. A third interlevel insulating film IL3 is formed, and on this insulating film, a third metal wiring line 24 is formed. The third metal wiring line 24 is covered with an insulating film PS such as a passivation film. The number of wiring layers can be increased or decreased as desired. The number of interlevel insulating films increases or decreases in correspondence to the number of wiring layers.

Figure 3B:
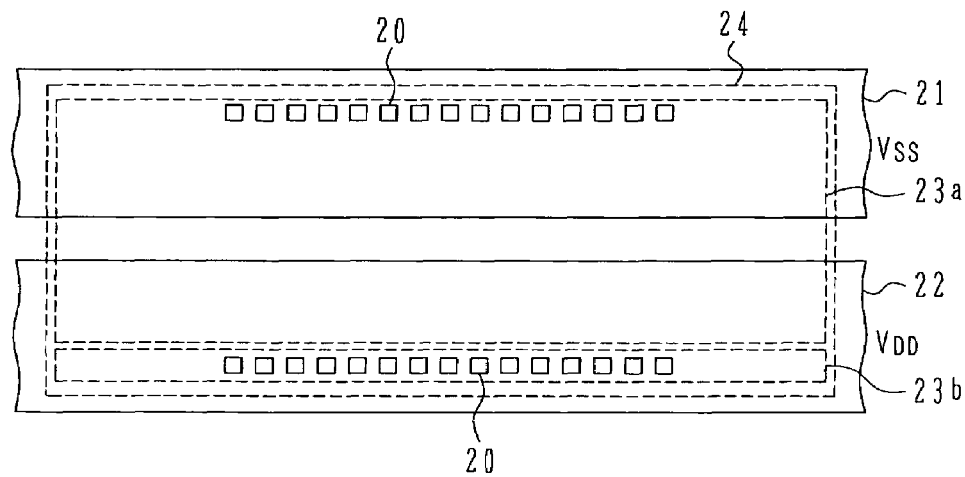
Figure 4A:
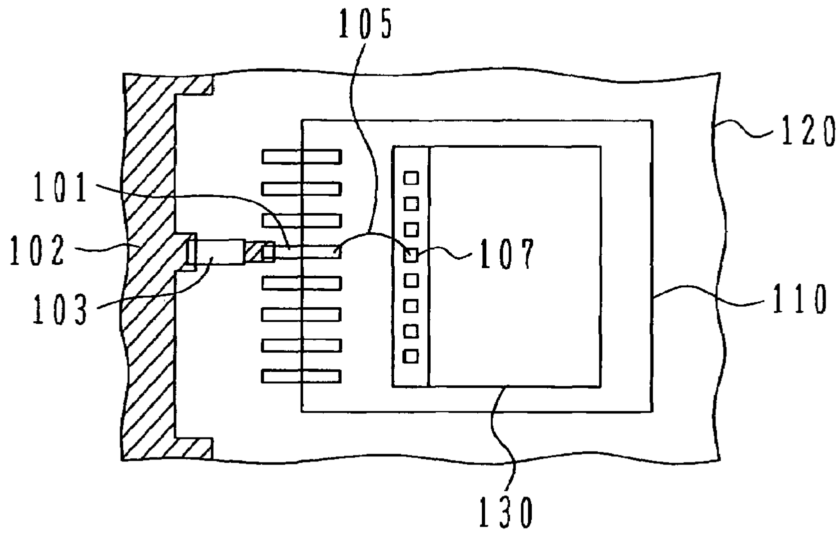
FIGS. 4A–4C are a plan view and an equivalent circuit diagram showing the structure of a bypass capacitor according to conventional techniques.
Figure 4B:
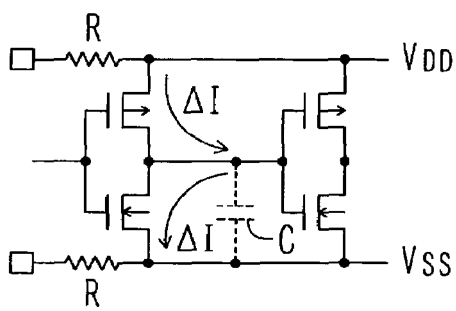
Figure 4C:
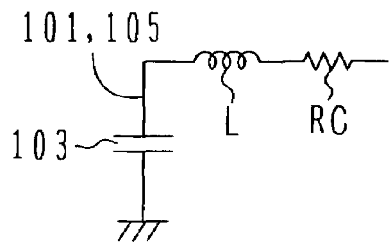

FIG. 3B is a plan view showing the layout of multi wiring layers. The second metal wiring line 23 above the power source voltage wiring lines 21 and 22 is separated into a main portion 23*a* and a subsidiary portion 23*b*. The main portion 23*a* extends broadly from above the wiring line $V_{SS}$ 21 to above the wiring line $V_{DD}$ 22, to widely overlap the wiring line $V_{DD}$ 22. The third metal wiring line 24 is formed broadly covering the second wiring lines 23*a* and 23*b*. The third metal wiring line 24 is connected via contacts 20 and the subsidiary portion 23*b* of the second metal wiring line to the wiring line $V_{DD}$ 22 of the first metal layer. The main portion 23*a* of the second metal wiring line is connected via contacts 20 to the wiring line $V_{SS}$ 21 of the first metal layer.

As shown in FIG. 3A, the structure that the main portion 23*a* of the second metal wiring line overlapping the upper and lower metal wiring lines 22 and 24 forms an additional capacitance. The main feature is that the intermediate wiring line overlaps in projection the upper and lower wiring lines and forms an additional capacitance, and the interconnection method and wiring pattern can be modified in various manners. For example, the main portion of the intermediate wiring line may be connected to the wiring line $V_{DD}$ and the upper and lower wiring lines may be connected to the wiring line $V_{SS}$. Instead of dividing the intermediate wiring line along the extension direction of the power source wiring lines as shown in FIG. 3B, it may be divided along the direction crossing the extension direction of the power source wiring lines. The upper wiring line may also be divided.

The present invention has been described in connection with the preferred embodiments. The invention is not limited only to the above embodiments. It will be apparent to those skilled in the art that other various modifications, improvements, combinations, and the like can be made.

What I claim are:

1. A semiconductor device comprising:

a semiconductor substrate having first and second active regions of a first conductivity type;

a first insulating layer formed on each of said first and second active regions;

first and second electrode structures formed above and crossing across intermediate portions of said first and second active regions, respectively;

a second insulating layer formed on said second electrode structure;

a third electrode structure formed on said second insulating layer;

a pair of first semiconductor regions of a second conductivity type opposite to said first conductivity type, formed in said first active region on both sides of said first electrode structure;

a pair of second semiconductor regions of said second conductivity type formed in said second active region on both sides of said second electrode structure;

an interlevel insulating layer formed to cover said first, second and third electrode structures;

first and second power source lines formed on said interlevel insulating layer above said second active region;

a first interconnection structure connecting said third electrode structure and at least one of said second semiconductor regions to said first power source line; and a second interconnection structure connecting said second electrode structure to said second power source line, wherein said first active region constitutes a MOS transistor and said second active region constitutes a bypass capacitor and induces an inversion layer of said second conductivity type under said second electrode structure when the power source lines are activated.

2. The semiconductor device according to claim 1, wherein said first, second, and third electrode structures are formed of polycrystalline silicon.

3. The semiconductor device according to claim 2, wherein said first and second insulating layers are formed of silicon oxide.

4. The semiconductor device according to claim 1, wherein said semiconductor substrate has said second conductivity type, said first interconnection structure connects said second active region, and said second interconnection structure connects said semiconductor substrate.

5. The semiconductor device according to claim 1, wherein said first electrode structure is formed of a same layer as said second electrode structure.

6. The semiconductor device according to claim 1, further comprising:

an upper insulating layer formed covering said power source lines; and multilayer wiring structure formed in said upper insulating layer, including a first wiring pattern having a portion above at least one of said power source lines and a second wiring pattern formed above said first wiring pattern;

wherein said first and second interconnection structures connect said first wiring pattern to the other of said power source lines, and said second wiring pattern to said one of the power source lines.

7. The semiconductor device according to claim 1, wherein said semiconductor substrate further has third and fourth active regions of said second conductivity type, and said first insulating layer is also formed on each of said third and fourth active regions, further comprising:

fourth and fifth electrode structures formed above and crossing across intermediate portions of said third and fourth active regions, respectively;

a third insulating layer formed on said fifth electrode structure;

a sixth electrode structure formed on said third insulating layer;

a pair of third semiconductor regions of said first conductivity type, formed in said third active region on both sides of said fourth electrode structure;

a pair of fourth semiconductor regions of said first conductivity type, formed in said fourth active region on both sides of said fifth electrode structure;

wherein said interlevel insulating layer also covers said fourth, fifth, and sixth electrode structures, said first and second power source lines also run above said fourth active region, further comprising:

a third interconnection structure connecting said sixth electrode structure and at least one of said fourth semiconductor regions to said second power source line; and a fourth interconnection structure connecting said fifth electrode structure to said first power source line, wherein said third active region constitutes a MOS transistor and said fourth active region constitutes a bypass capacitor and induces an inversion layer of said first conductivity type under said fifth electrode structure when the power source lines are activated.

8. The semiconductor device according to claim 7, wherein said fourth, fifth, and sixth electrode structures are formed of polycrystalline silicon.

9. The semiconductor device according to claim 8, wherein said third insulating layer is formed of silicon oxide.

10. The semiconductor device according to claim 7, wherein said semiconductor substrate has said second conductivity type, said third interconnection structure connects said fourth active region.

11. The semiconductor device according to claim 7, wherein said fourth electrode structure is formed of a same layer as said second and fifth electrode structures.

12. The semiconductor device according to claim 7, wherein said sixth electrode structure is formed of a same layer as said third electrode structure.

13. The semiconductor device according to claim 7, further comprising:

an upper insulating layer formed covering said first, second, third and fourth active regions, and a multilayer wiring structure formed in said upper insulating layer, including a third wiring pattern formed above said fourth active region and a fourth wiring pattern formed above said third wiring pattern, and said third and fourth interconnection structures connect said third wiring pattern to one of said power source lines, and said fourth wiring pattern to the other of said power source lines.

* * * * *